United States Patent [19]

Tomasetta et al.

[11] 4,314,858
[45] Feb. 9, 1982

[54] METHOD OF MAKING A FULLY INTEGRATED MONOLITHIC OPTICAL RECEIVER

[75] Inventors: Louis R. Tomasetta; H. David Law, both of Thousand Oaks, Calif.

[73] Assignee: Rockwell International Corporation, El Segundo, Calif.

[21] Appl. No.: 96,872

[22] Filed: Nov. 23, 1979

[51] Int. Cl.$^3$ .................... H01L 33/00; H01L 27/14; H01L 29/161
[52] U.S. Cl. .................... 148/1.5; 148/175; 148/187; 357/30; 357/42; 29/572; 29/577 C
[58] Field of Search .................... 148/1.5, 187, 175; 357/30, 42

[56] References Cited

U.S. PATENT DOCUMENTS

| | | | |
|---|---|---|---|
| 3,982,315 | 9/1976 | Kubo | 29/572 |
| 4,116,717 | 9/1978 | Rahilly | 136/89 SJ |
| 4,137,543 | 1/1979 | Beneking | 357/30 |
| 4,212,020 | 7/1980 | Yariv et al. | 357/17 |

OTHER PUBLICATIONS

DeWitt IBM—Tech. Discl. Bull. 9 (1966) 102.
Statz, H. IBM—Tech. Discl. Bull. 11 (1968) 397.
Eden et al., IEEE J. Solid St. Cir. vol. SC-13, (1978) 419.
Tomsetta et al., IEEE J. Quantum Electronics, QE-14 (Nov. 1978) 800.

*Primary Examiner*—Upendra Roy
*Attorney, Agent, or Firm*—H. Fredrick Hamann; Craig O. Malin; John J. Deinken

[57] ABSTRACT

Disclosed is a fully integrated monolithic optical receiver and a method of manufacturing such a receiver, including the steps of providing a semi-insulating substrate having a major surface, growing an epitaxial layer of a first conductivity type over the major surface, selectively removing the epitaxial layer to establish a detector area defined by the remaining portion of the layer, selectively implanting a relatively heavily doped region of a first conductivity type in the epitaxial layer, selectively implanting a relatively heavily doped region of a second conductivity type in the epitaxial layer and spaced from the implanted region of the first conductivity type, selectively implanting a relatively heavily doped source region of the first conductivity type in the major surface of the substrate, selectively implanting a relatively heavily doped drain region of the first conductivity type in the major surface and spaced from the source region, selectively implanting a gate region of the first conductivity type between the source and drain regions, capping the receiver with an insulating layer, forming a plurality of metalization contacts through the insulating layer and in respective electrical contact with the regions of first and second conductivity type in the epitaxial layer and with the source, drain, and gate regions, and interconnecting the metalization contacts.

4 Claims, 12 Drawing Figures

*FIG. II.*

METHOD OF MAKING A FULLY INTEGRATED MONOLITHIC OPTICAL RECEIVER

BACKGROUND OF THE INVENTION

This invention is related to the field of solid state devices and, more particularly, to solid state optical-electronic system.

Solid state optical-electronic systems are useful in a wide variety of applications. One area, for example, where such equipment has become increasingly important is in optical communications systems, in which information is transmitted by means of a signal in the optical range of the electromagnetic spectrum. The uses and requirements of solid state optical-electronic systems in the optical communications environment will serve to exemplify the importance of such technology.

The availability of optical fibers which exhibit a very low loss and near zero dispersion has made feasible the development of optical communication systems capable of operating at very high data rates. Three other major components, however, must be provided before a practical high data rate communications system may be realized. Required are a reliable, high speed light source, a high speed, high quantum efficiency photodetector, and very low noise, high speed electronics which can be applied to signal processing and control functions.

The development of high performance photodetectors, such as avalanche photodetectors (APDs), has provided the necessary high quantum efficiency and has led to important advances in fiber optics communications systems, as well as in other areas, such as active laser imaging, laser satellite communication, laser diagnostics, laser range finding, and picosecond light pulse measurements. The application of III-V alloys to photodetector technology has further led to the development of avalanche photodetectors which exhibit superior properties in comparison to previous designs utilizing germanium and silicon. By adjusting the alloy composition, for example, the wavelength response of a III-V alloy photodiode can be tuned. Moreover, because of the high absorption coefficients of the direct bandgap III-V alloys, the quantum efficiency of such a photodiode is high, even when the diode is fabricated with a narrow depletion region to provide a high speed response. In addition, heterostructure window layers can be grown in III-V alloy photodiodes so that high speed performance is obtained while at the same time the loss of photogenerated carries due to surface recombination is reduced.

Another component which is required in an optical communications system is low noise, high speed processing electronics, which has been supplied with the development of the transimpedance amplifier. By hybrid integrating a high speed, high quantum efficiency III-V avalanche photodetector with a transimpedance amplifier utilizing GaAs FET electronics, an optical receiver has been produced with from 10 to 20 times better sensitivity than is available with germanium APDs. Such hybrid receiver designs, however, introduce construction difficulties due to the need to interface the optical device with the necessary control and signal processing circuitry and achieve a system with a desired level of performance. It would be advantageous to integrate these optical and electronics functions in a single unit, but this has not heretofore been possible with traditional silicon-based devices, because there are no semi-insulating substrates available in silicon technology to provide the necessary isolation between the electronics and the detector. Furthermore, the optical properties of silicon necessitate an optically active layer of considerably greater thickness (10–100 $\mu$m) than can be easily fabricated by available techniques. A practical integrated optical receiver design, however, would be an advantageous addition to optical technology and would be particularly useful in the area of optical communications systems.

SUMMARY OF THE INVENTION

It is a general object of this invention to provide a method of manufacturing a fully integrated monolithic optical receiver.

A method of manufacturing a fully integrated monolithic optical receiver, according to the present invention, includes the steps of:

(a) providing a semi-insulating substrate having a major surface, (b) fabricating an optical detector on the major surface, (c) fabricating an electronic circuit on the major surface, and (d) electrically coupling the detector to the circuit.

In a more particular embodiment, the step of fabricating an optical detector further includes the steps of:

(1) growing an expitaxial layer of a first conductivity type over the major surface, (2) selectively removing the epitaxial layer to form a detector region defined by the remaining portion of the layer, (3) selectively implanting a relatively heavily doped region of the first conductivity type in the epitaxial layer, and (4) selectively implanting a relatively heavily doped region of a second conductivity type in the epitaxial layer and spaced from the implanted region of the first conductivity type.

In another more particular embodiment, the step of fabricating an electronic circuit further includes forming at least one field effect transistor by the steps of:

(1) selectively implanting a relatively heavily doped source region of a first conductivity type in the major surface of the substrate, (2) selectively implanting a relatively heavily doped drain region of the first conductivity type in the major surface of the substrate, and (3) selectively implanting a gate region of the first conductivity type in the major surface of the substrate and between the source and drain regions.

In yet another more particular embodiment, the step of electrically coupling the detector to the circuit further includes the steps of:

(1) capping the receiver with an insulating layer, (2) forming metalization contacts through the insulating layer and in electrical contact with the optical detector, (3) forming metalization contacts through the insulating layer and in electrical contact with the electronic circuit, and (4) coupling the detector to the circuit by interconnecting the metalization contacts.

These examples of the more important features of the invention have been broadly outlined in order to facilitate an understanding of the detailed description which follows and so that the contributions which this invention provides to the art may be better appreciated. There are, of course, additional features of the invention, which will be further described below and which are included within the subject matter of the appended claims.

BRIEF DESCRIPTION OF THE DRAWINGS

Additional objects, features, and advantages of the present invention will become apparent by referring to the detailed description of the preferred embodiments in connection with the accompanying drawings, wherein the same reference numerals refer to like elements throughout all the figures. In the drawings.

DESCRIPTION OF THE PREFERRED EMBODIMENTS

The successful evolution of III-V optical and electronic devices from laboratory curiosities to production components has provided a practical means for developing vastly improved electronic and optical-electronic systems. GaAs field effect transistors (FETs) and semiconductor lasers, for example, are now commercially available, while researchers have demonstrated GaAs digital integrated circuits and charge coupled devices (CCDS) capable of high speeds and low-powered dissipations which are unachievable with silicon-based devices of similar geometries. The complexity (i.e., the number of active components) which has been attained with such circuits is increasing, laboratory GaAs circuits with approximately 100 gates having been demonstrated. Although the technology of integrated optics, which utilizes optical interactions to achieve the desired signal processing, is available, the advent of this practical III-V device capability has enabled the development of an entirely new technology involving the combination of both optical and electornic III-V structures to achieve monolithic integrated circuits. Such integration of an optical detector and on-chip electronics was previously unknown, because no process was available which was compatible with fabricating both a detector and the electronics, and because it was not possible to isolate from the electronics the high bias voltage needed for the detector. The present inventors, however, have employed a number of characteristics unique to III-V alloys to develop an important new technique for monolithically integrating optical and electronic functions on a single substrate. The availability of semi-insulating III-V substrates enables the built-in isolation of electronic components so that a number of vastly different devices can be formed in a single substrate and operated with different bias voltages. In addition, the direct gap nature of many III-V semiconducting alloys makes possible the fabrication of high efficiency, low power consumption optical sources and detectors with unusually thin active layers (i.e., 1-2 $\mu$m as compared to 10 $\mu$m for silicon devices). Finally, epitaxial heterojunction techniques facilitate the assembly of multi-layer III-V alloy structures with different optical and electronic properties, resulting in the achievement of vastly more efficient optical and electronic devices than heretofore available.

Figure 1:
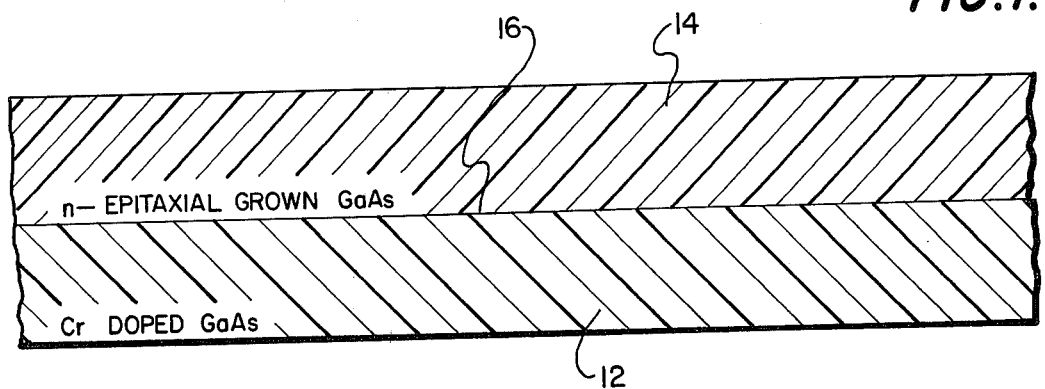
FIGS. 1-10 portray a series of steps involved in the process of manufacturing an integrated optical receiver, which is illustrated in a cross-sectional side view.

Now referring to FIGS. 1-10, a series of steps in the process of manufacturing an optical receiver according to the present invention is illustrated with the receiver shown in a cross-sectional side view. The method of manufacturing a fully integrated monolithic optical receiver, which is shown in completed form in FIG. 10, begins with a semi-insulating substrate 12, which is composed of Cr doped GaAs in the preferred embodiment. As shown in FIG. 1, an epitaxial layer 14 of a first conductivity type is grown over a major surface 16 of the semi-insulating substrate 12 to define the active layer for an avalanche photodetector (APD). In the preferred embodiment, a 2-3 $\mu$m layer of epitaxial n type GaAs is grown for this purpose. Alternatively, this active layer may be defined by an ion implantation of the first conductivity type to a depth of 2-3 $\mu$m in the substrate 12.

Figure 2:
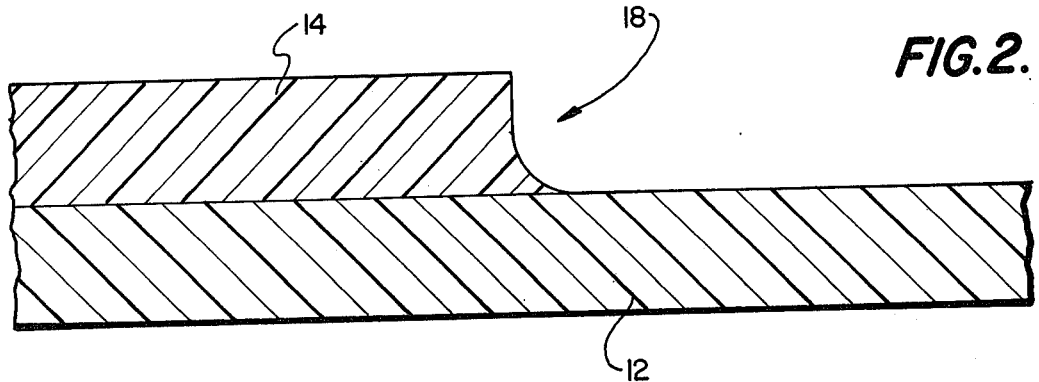

When the active layer is formed by epitaxial growth techniques, as illustrated in FIG. 1, the layer is then selectively etched down to the substrate 12, leaving a mesa-like detector area 18, as shown in FIG. 2. The remaining steps in the process, which are illustrated in FIGS. 3-10, involve forming an optical detector in the detector area 18, forming electronic processing and control circuitry in the substrate 12, and interconnecting the detector and the electronic circuitry.

Figure 3:
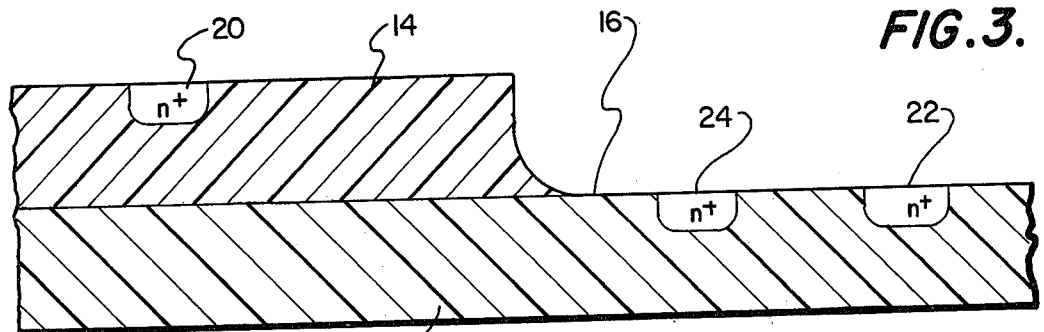
Figure 4:
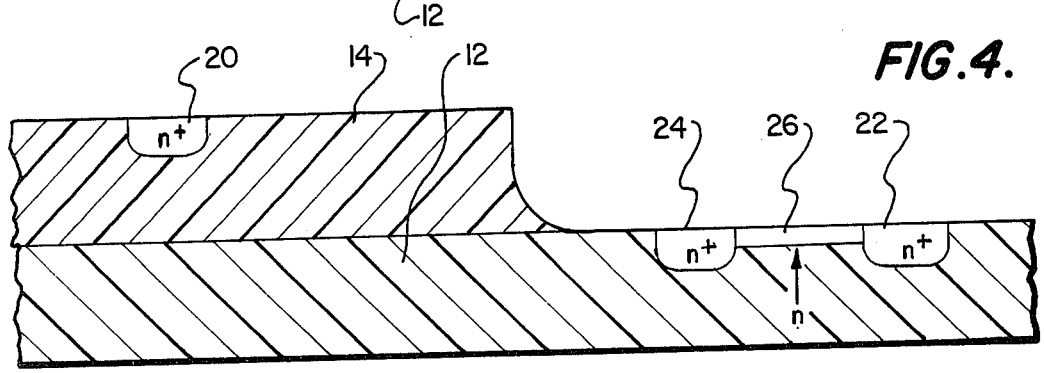
Figure 5:
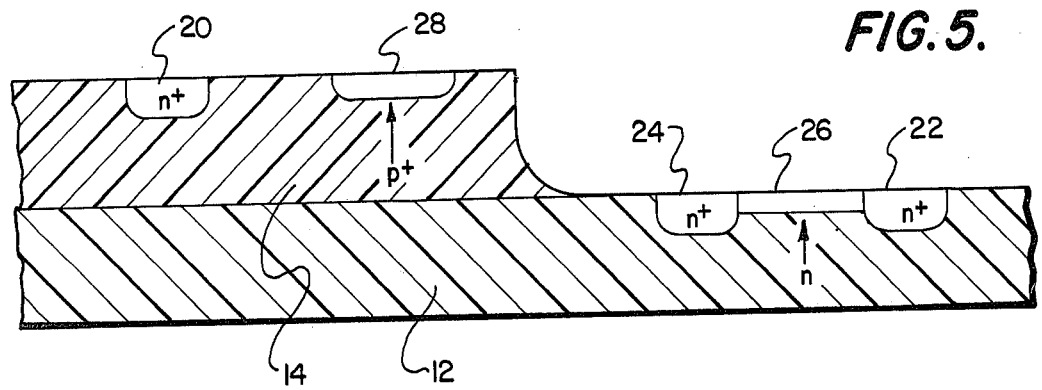

As shown in FIG. 3, the technique of pocket ion implantation is utilized to implant several relatively heavily doped regions of the first conductivity type: a first bias contact 20 for the detector is implanted in the layer 14, and source and drain regions 22 and 24, respectively, are implanted in the major surface 16 to establish a first stage field effect transistor (FET) which is part of the electronic processing circuitry for the receiver. This first stage FET is directly connected to the APD in the completed receiver, and additional elements and components of the electronic circuitry are formed in the substrate 12. Since the formation and interconnection of these additional components is entirely conventional, there is no need to further illustrate and discuss them here. In the preferred embodiment, an Se implantation is used to create the n+ areas for the contact 20, the source 22, and the drain 24. A gate region 26 of the first conductivity type is then implanted in the substrate between the source and drain regions, as shown in FIG. 4. A relatively heavily doped region 28 of a second conductivity type, as illustrated in FIG. 5, is implanted in the layer 14 to provide an optically active region 28 for the optical detector. In the preferred embodiment, the region 28 is formed by a beryllium ion implantation.

Figure 6:
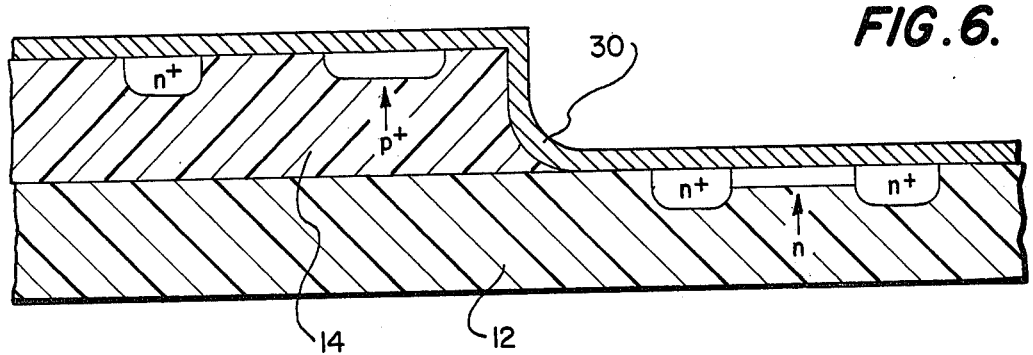

Next, the remaining portion of the epitaxial layer 14 and the exposed portion of the substrate 12 are capped with an insulating layer 30, as shown in FIG. 6. In the preferred embodiment, a layer of $Si_3N_4$ is deposited to establish this capping layer. After the insulating layer 30 is established, the device is annealed to activate the implanted areas.

Figure 7:
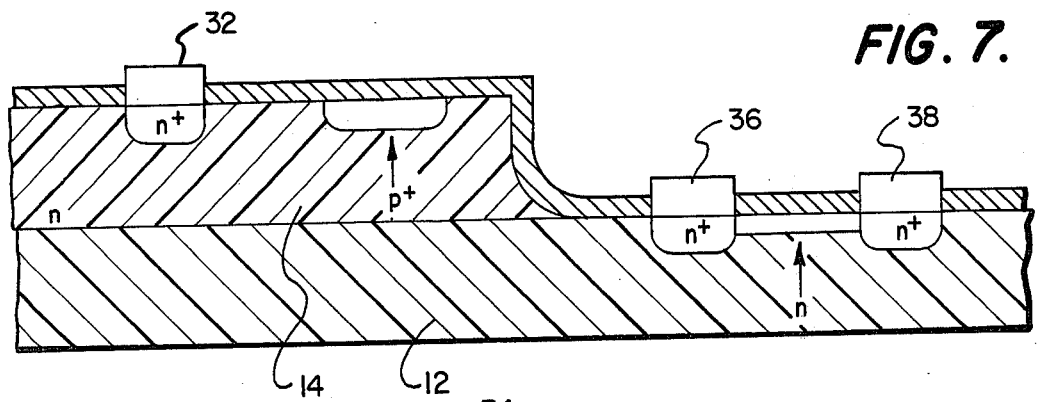
Figure 8:
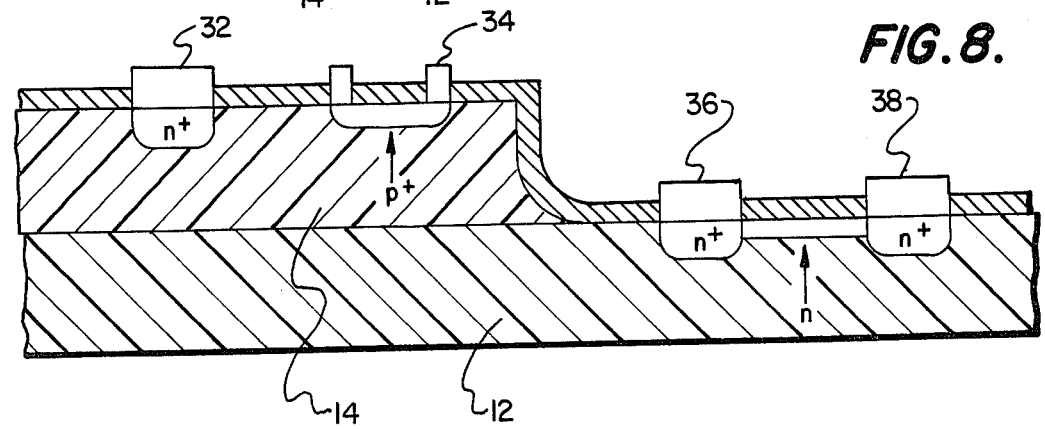
Figure 9:
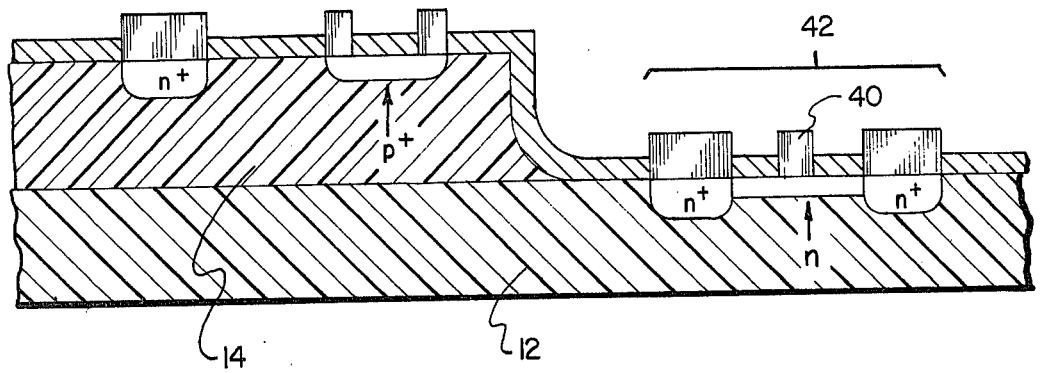

As shown in FIGS. 7 and 8, the insulating layer 30 is then selectively removed from above the implanted regions and metalization contacts 23, 34, 36 and 38 are deposited to provide electrical contact with the first bias contact 20, the optically active region 28, the drain region 24, and the source region 22. In the preferred embodiment, metalization contacts 32, 36, and 38 are made with a AuGe deposit, while the contact 34 is made of AgMn-Au. In addition, a proton bombarded ring may be established if desired around the region 28 to effectively control edge breakdown. The metalization contacts are then alloyed. As shown in FIG. 9, metalization contact 40 is established for the gate region 26, completing the structure of the first stage signal processing metal semiconductor FET 42. In the preferred embodiment, a Ti-Pt-Au alloy is used for the metalization contact 40.

Figure 10:
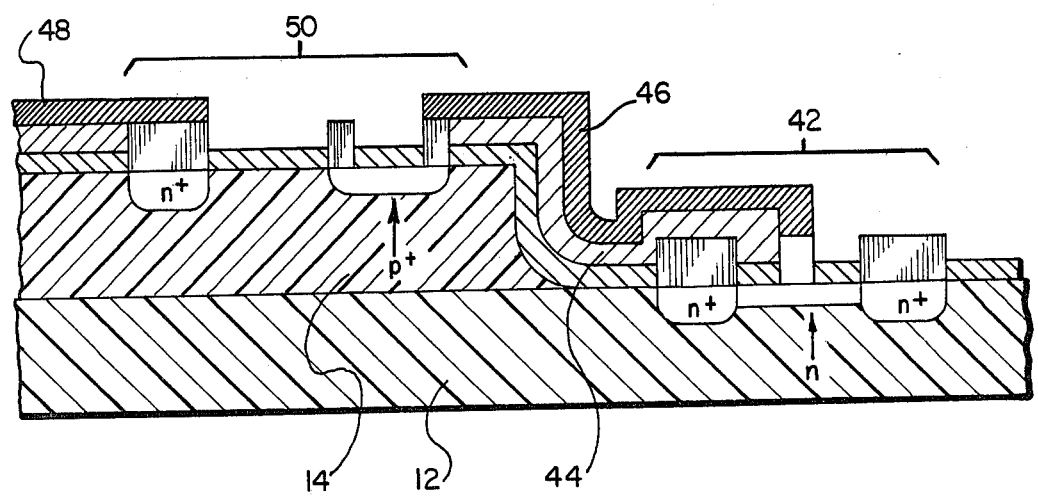

Finally, as shown in FIG. 10, an additional insulating layer 44 is added over the drain region 24 and its contact 36, and metalization lines, such as lines 46 and 48, are added as necessary to interconnect the optical detector and the electronic circuitry and to provide external connections to the receiver.

The completed receiver is illustrated in FIG. 10, which shows the APD 50 and the input MESFET 42 for the electronic processing circuitry. As will be appreciated by those skilled in the art, additional components typically will be provided to complete the electronic circuitry for the receiver and may be formed in the substrate 12 by conventional techniques, so that there is no need to illustrate the fabrication of additional devices other than the MESFET 42. In addition, passive circuit components, such as resistors and capacitors, may be fabricated, according to techniques known in the art, by metalization on the semi-insulating substrate 12.

Figure 11:
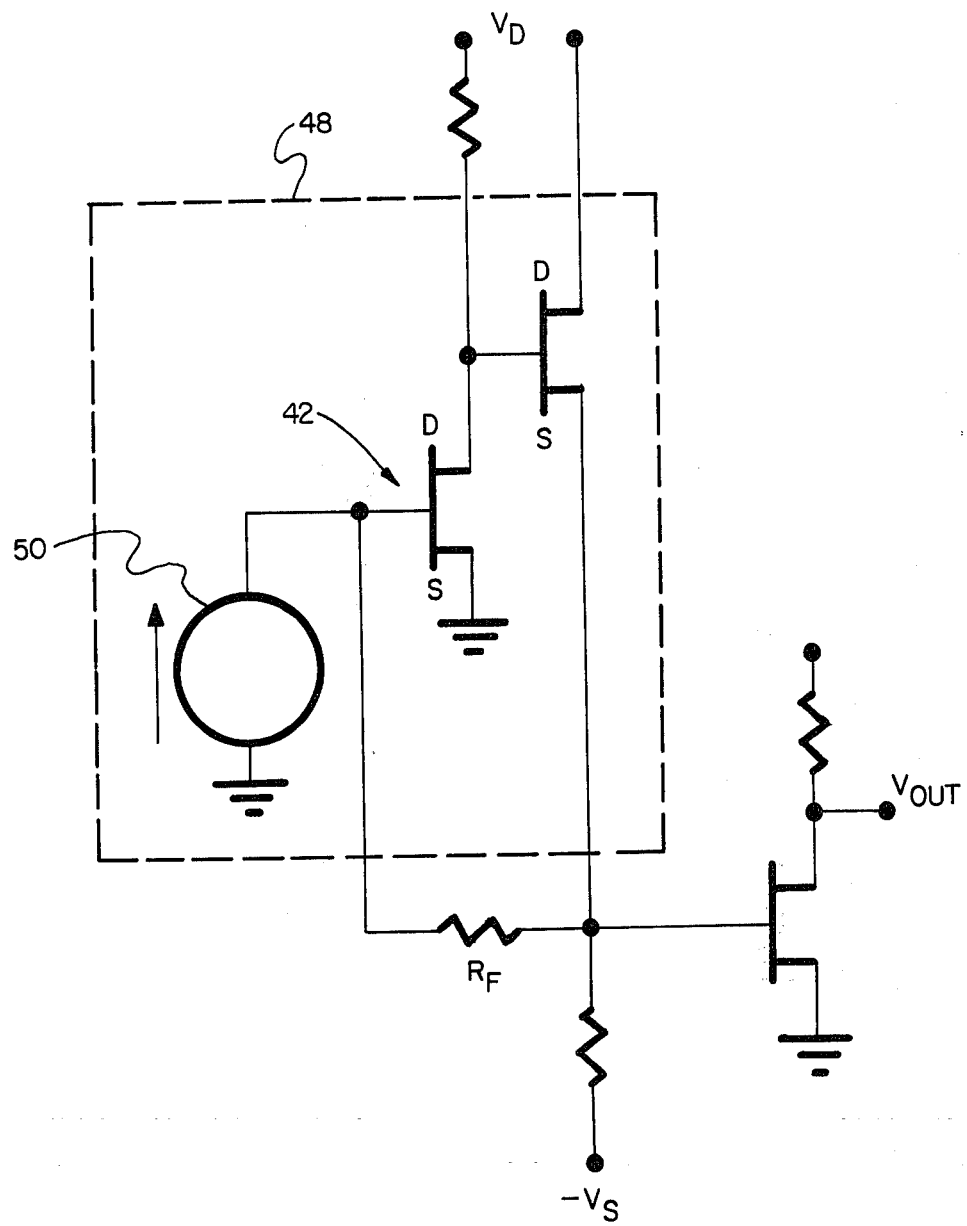
FIG. 11 is an electrical schematic diagram for a transimpedance amplifier circuit which may be advantageously incorporated into the optical receiver of this invention.

One electronic circuit which may be particularly useful when employed in the processing circuitry for such a receiver is a transimpedance amplifier, such as that illustrated in the electrical schematic of FIG. 11, where the components which are fabricated on-chip are contained within the dotted outline 48, including the photodetector 50 and the first stage MESFET 42. Some of the advantages of coupling an avalanche photodetector to such a transimpedance amplifier are discussed with respect to a hybrid receiver design in Tomasetta, Law, Eden, Deyhimy, and Nakano, High Sensitivity Optical Receivers for 1.0–1.4 μm Fiber-Optic Systems, IEEE Journal of Quantum Electronics, Vol. QE-14, No. 11, page 800, November, 1978, the teaching of which is incorporated herein by reference.

Figure 12:
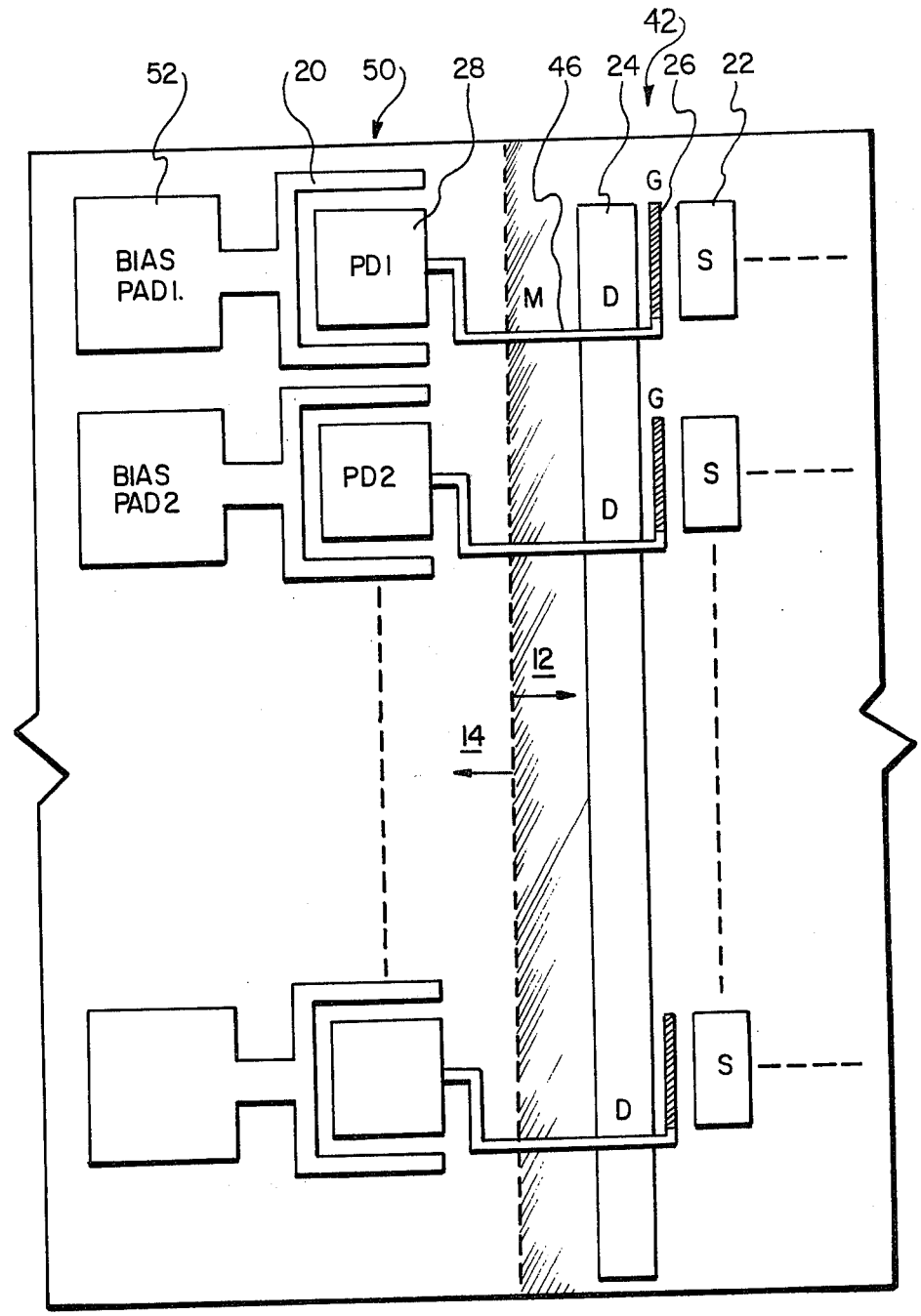
FIG. 12 is a top view of a layout pattern for an array of integrated optical receivers constructed according to the present invention.

Because of the techniques which have been provided by this invention, it has now become feasible to construct large arrays of avalanche photodetectors, because the bias control, temperature compensation, automatic gain control, and transimpedance amplifier circuitry for each element can be monolithically integrated onto the same chip as the detector. Now referring to FIG. 12, a top view of a layout pattern for an array of optical receivers constructed according to the present invention is illustrated. Each receiver in the array includes an avalanche photodetector 50, including the optically active region 28, the first bias contact 20, and a bias pad 52 for facilitating an external connection to the detector, and associated processing electronics, the latter element being represented in FIG. 12 by a first stage MESFET 42, including the source region 22, the drain region 24, and the gate region 26. The detectors are formed on the epitaxial layer 14, while the electronics is fabricated directly on the semi-insulating substrate 12. The optical and electronic elements of the array are interconnected by metalization lines 46. Those skilled in the art will appreciate that additional circuit elements can be added to the array as necessary to accomplish amplification, bias control, temperature compensation, and any other desired processing or control functions.

In summary, the integrated optical receiver of the present invention establishes a significant advance in the state-of-the-art of optical communications system, as well as in other optical and electronics applications for an integrated optical-electronic receiver. In the receiver of this invention, a semi-insulating substrate isolates each active element and provides an extremely low capacitance to ground. As a result, the receiver may incorporate an amplifier with a higher sensitivity than one fabricated by hybrid techniques. Furthermore, the detector is thus floated from the associated electronics, i.e., no common ground exists between the electronics and the optical elements, but direct contact is made to both electrical terminals. The completely planar nature of the detector resulting from this design eliminates the problem of surface leakage currents which are ordinarily caused from exposing the pn junction to the external environment. Furthermore, bias control and automatic gain control circuitry, which are crucial for maintaining the gain and sensitivity of each element is an optical receiver array constant, may be incorporated onto the same chip in the present invention.

Although typical embodiments of the present invention have been illustrated and discussed herein, numerous modifications and alternative embodiments of the apparatus and method of this invention will be apparent to those skilled in the art in view of this description. Accordingly, this description is to be considered as illustrative only and is provided for the purpose of teaching those skilled in the art the manner of constructing the apparatus and performing the method of this invention. Furthermore, it should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit attained through reading the above description of the invention.

What is claimed is:

1. A method of manufacturing a fully integrated monolithic optical receiver, comprising the steps of:
    (a) providing a semi-insulating III-V alloy substrate having a major surface;
    (b) fabricating an optical detector on the major surface by
        (1) growing an epitaxial semiconducting layer of a first conductivity type III-V alloy over the major surface,
        (2) selectively removing the epitaxial layer to leave a detector region defined by the remaining portion of the layer,
        (3) selectively implanting a relatively heavily doped region of the first conductivity type in the epitaxial layer, and
        (4) selectively implanting a relatively heavily doped region of a second conductivity type in the epitaxial layer and spaced from the implanted region of the first conductivity type;
    (c) fabricating an electronic circuit on the major surface; and (d) electrically coupling the detector to the circuit.

2. The method of claim 1, wherein step (c) of fabricating an electronic circuit further comprises forming at least one field effect transistor by the steps of:
(1) selectively implanting a relatively heavily doped source region of a first conductivity type in the major surface of the substrate;
(2) selectively implanting a relatively heavily doped drain region of the first conductivity type in the major surface of the substrate; and
(3) selectively implanting a gate region of the first conductivity type in the major surface of the substrate and between the source and drain region.

3. The method of claim 1, wherein step (d) of electrically coupling the detector to the circuit further comprises the steps of:
(1) capping the receiver with an insulating layer;
(2) forming metalization contacts through the insulating layer and in electrical contact with the optical detector;
(3) forming metalization contacts through the insulating layer and in electrical contact with the electronic circuit; and
(4) coupling the detector to the circuit by interconnecting the metalization contacts.

4. A method of manufacturing a fully integrated monolithic optical receiver, comprising the steps of:
(a) providing a semi-insulating III-V alloy substrate having a major surface;
(b) growing an epitaxial semiconducting layer of a first conductivity type III-V alloy over the major surface;
(c) selectively removing the epitaxial layer to establish a detector area defined by the remaining portion of the layer;
(d) selectively implanting a relatively heavily doped region of the first conductivity type in the epitaxial layer;
(e) selectively implanting a relatively heavily doped region of a second conductivity type in the epitaxial layer and spaced from the implanted region of the first conductivity type;
(f) selectively implanting a relatively heavily doped source region of the first conductivity type in the major surface of the substrate;
(g) selectively implanting a relatively heavily doped drain region of the first conductivity type in the major surface and spaced from the source region;
(h) selectively implanting a gate region of the first conductivity type between the source and drain regions;
(i) capping the receiver with an insulating layer;
(j) forming a plurality of metalization contacts through the insulating layer and in respective electrical contact with the regions of first and second conductivity type in the epitaxial layer and with the source, drain, and gate regions; and
(k) interconnecting the metalization contacts.

* * * * *